United States Patent
Ahmad et al.

(10) Patent No.: US 9,939,509 B2
(45) Date of Patent: Apr. 10, 2018

(54) VARIABLE DENSITY INCOHERENT SPATIOTEMPORAL ACQUISITION (VISTA) FOR HIGHLY ACCELERATED MAGNETIC RESONANCE IMAGING

(71) Applicant: Ohio State Innovation Foundation, Columbus, OH (US)

(72) Inventors: Rizwan Ahmad, Columbus, OH (US); Orlando P. Simonetti, Columbus, OH (US); Yu Ding, Hilliard, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 597 days.

(21) Appl. No.: 14/593,322

(22) Filed: Jan. 9, 2015

(65) Prior Publication Data
US 2015/0212177 A1    Jul. 30, 2015

Related U.S. Application Data

(60) Provisional application No. 61/932,732, filed on Jan. 28, 2014.

(51) Int. Cl.
*G01V 3/00* (2006.01)
*G01R 33/561* (2006.01)
*G01R 33/48* (2006.01)
*G01R 33/56* (2006.01)
*G01R 33/563* (2006.01)

(52) U.S. Cl.
CPC ..... *G01R 33/5619* (2013.01); *G01R 33/4818* (2013.01); *G01R 33/482* (2013.01); *G01R 33/4824* (2013.01); *G01R 33/4826* (2013.01); *G01R 33/5608* (2013.01); *G01R 33/56325* (2013.01)

(58) Field of Classification Search
CPC ............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

2006/0008179 A1* 1/2006 Fischer ............. G06T 7/33 382/294
2013/0278261 A1* 10/2013 Fielden ............. G01R 33/5608 324/309

OTHER PUBLICATIONS

Ahmad R, Potter L, Kuppusamy P. Oscillating Radial Trajectories for Reduced Undersampling Artifacts. In: Proceedings 17th Scientific Meeting, International Society for Magnetic Resonance in Medicine. vol. 17. ; 2009. p. 576.

(Continued)

*Primary Examiner* — Walter L Lindsay, Jr.
*Assistant Examiner* — Frederick Wenderoth
(74) *Attorney, Agent, or Firm* — Meunier Carlin & Curfman LLC

(57) ABSTRACT

A pseudo-random, incoherent sampling technique, called Variable density Incoherent Spatiotemporal Acquisition (VISTA) is disclosed, which is based on minimal Riesz energy problem. Compared with other pseudorandom methods (e.g., PDS), VISTA has the unique ability to incorporate a variety of problem-specific constraints. In this study, VISTA was applied to real-time CMR, where it not only provided an incoherent sampling with variable density but also ensured a constant temporal resolution and a fully sampled time-averaged data.

22 Claims, 11 Drawing Sheets

(56) References Cited

OTHER PUBLICATIONS

Attili, Anil K., et al. "Quantification in cardiac MRI: advances in image acquisition and processing." The international journal of cardiovascular imaging 26.1 (2010): 27-40.
Beck, Amir, and Marc Teboulle. "A fast iterative shrinkage-thresholding algorithm for linear inverse problems." SIAM journal on imaging sciences 2.1 (2009): 183-202.
Becker, Stephen, Jérôme Bobin, and Emmanuel J. Candès. "NESTA: a fast and accurate first-order method for sparse recovery." SIAM Journal on Imaging Sciences 4.1 (2011): 1-39.
Bendito, Enrique, et al. "Estimation of Fekete points." Journal of Computational Physics 225.2 (2007): 2354-2376.
Bieri, O., M. Markl, and Klaus Scheffler. "Analysis and compensation of eddy currents in balanced SSFP." Magnetic resonance in medicine 54.1 (2005): 129-137.
Brodsky, Ethan K., Alexey A. Samsonov, and Walter F. Block. "Characterizing and correcting gradient errors in non-cartesian imaging: Are gradient errors linear time-invariant (LTI)?." Magnetic Resonance in Medicine 62.6 (2009): 1466-1476.
Buehrer, Martin, et al. "Array compression for MRI with large coil arrays." Magnetic Resonance in Medicine 57.6 (2007): 1131-1139.
Candès, Emmanuel J., and Michael B. Wakin. "An introduction to compressive sampling." Signal Processing Magazine, IEEE 25.2 (2008): 21-30.
Dietrich, Olaf, et al. "Measurement of signal-to-noise ratios in MR images: Influence of multichannel coils, parallel imaging, and reconstruction filters." Journal of Magnetic Resonance Imaging 26.2 (2007): 375-385.
Dijk J, van Ginkel M, van Asselt RJ, van Vliet LJ, Verbeek PW. A new sharpness measure based on Gaussian lines and edges. In: 8th Conf Adv School Comput Imaging. 2002. pp. 39-43.
Ding Y, Ahmad R, Xue H, Ting ST, Jin N, Simonetti OP. "Comparing Boundary Sharpness of SENSE and GRAPPA." In: ISMRM Workshop on Data Sampling and Image Reconstruction. Sedona, AZ, USA; 2013, 1 page.
Feng, Li, et al. "Highly accelerated real-time cardiac cine MRI using k-t SPARSE-SENSE." Magnetic Resonance in Medicine 70.1 (2013): 64-74.
Fornasier, Massimo, and Holger Rauhut. "Recovery algorithms for vector-valued data with joint sparsity constraints." SIAM Journal on Numerical Analysis 46.2 (2006): 577-613.
Hardin, D. P., and E. B. Saff. "Discretizing manifolds via minimum energy points." Notices of the AMS 51.10 (2004): 1186-1194.
Jung, Hong, et al. "Radial k-t FOCUSS for high-resolution cardiac cine MRI." Magnetic Resonance in Medicine 63.1 (2010): 68-78.
Jung, Youngkyoo, et al. "Consistent non-cartesian off-axis MRI quality: Calibrating and removing multiple sources of demodulation phase errors." Magnetic Resonance in Medicine 57.1 (2007): 206-212.
Kim, Daniel, et al. "Accelerated phase-contrast cine MRI using k-t SPARSE-SENSE." Magnetic Resonance in Medicine 67.4 (2012): 1054-1064.
Kövari, T., and Ch Pommerenke. "On the distribution of Fekete points." Mathematika 15.01 (1968): 70-75.
Kuijlaars, A. B. J., E. B. Saff, and X. Sun. "On separation of minimal Riesz energy points on spheres in Euclidean spaces." Journal of computational and applied mathematics 199.1 (2007): 172-180.
Liu, Duan-duan, et al. "Under-sampling trajectory design for compressed sensing based DCE-MRI." Engineering in Medicine and Biology Society (EMBC), 2013 35th Annual International Conference of the IEEE. IEEE, 2013, pp. 2624-2627.
Liu, Jun, et al. "2D bSSFP real-time cardiac CINE-MRI: compressed sensing featuring weighted redundant Haar Wavelet regularization in space and time." Journal of Cardiovascular Magnetic Resonance 15.Suppl 1 (2013): P49.
Luenberger, David G. Optimization by vector space methods. John Wiley & Sons, 1997, 45 pages.
Lustig, Michael, David Donoho, and John M. Pauly. "Sparse MRI: The application of compressed sensing for rapid MR imaging." Magnetic resonance in medicine 58.6 (2007): 1182-1195.
Lustig, Michael, et al. "Compressed sensing MRI." Signal Processing Magazine, IEEE 25.2 (2008): 72-82.
Lustig, M., et al. "L1 SPIR-iT: autocalibrating parallel imaging compressed sensing." Proc Intl Soc Mag Reson Med. . 2009, p. 379.
Lustig, Michael, and John M. Pauly. "SPIRiT: Iterative self-consistent parallel imaging reconstruction from arbitrary k-space." Magnetic Resonance in Medicine 64.2 (2010): 457-471.
Majumdar Angshul, and Rabab K. Ward. "An algorithm for sparse MRI reconstruction by Schatten p-norm minimization." Magnetic resonance imaging 29.3 (2011): 408-417.
Markl, Michael, and Jürgen Hennig. "Phase contrast MRI with improved temporal resolution by view sharing: k-space related velocity mapping properties." Magnetic resonance imaging 19.5 (2001): 669-676.
Marzo, Jordi, and Joaquim Ortega-Cerdà. "Equidistribution of the Fekete points on the sphere." arXiv preprint arXiv:0808.1202 (2008), 8 pages.
Murphy, Mark, et al. "Fast-SPIRiT compressed sensing parallel imaging MRI: scalable parallel implementation and clinically feasible runtime." Medical Imaging, IEEE Transactions on 31.6 (2012): 1250-1262.
Osher, Stanley, et al. "Fast linearized Bregman iteration for compressive sensing and sparse denoising." arXiv preprint arXiv:1104.0262 (2011), 19 pages.
Otazo, Ricardo, et al. "Combination of compressed sensing and parallel imaging for highly accelerated first-pass cardiac perfusion MRI." Magnetic Resonance in Medicine 64.3 (2010): 767-776.
Palaniappan, Prashanth, Orlando P. Simonetti, and Yu Ding. "Denoising of dynamic magnetic resonance images by the combined application of wavelet filtering and Karhunen-Loeve Transform (KLT)." Journal of Cardiovascular Magnetic Resonance 14.Suppl 1 (2012): W71, 1 page.
Ramani, Sathish, and Jeffrey Fessler. "Regularized parallel MRI reconstruction using an alternating direction method of multipliers." Biomedical Imaging: From Nano to Macro, 2011 IEEE International Symposium on. IEEE, 2011, 4 pages.
Sobol, Wlad T. "Recent advances in MRI technology: Implications for image quality and patient safety." Saudi Journal of Ophthalmology 26.4 (2012): 393-399.
Som, Subhojit, and Philip Schniter. "Compressive imaging using approximate message passing and a Markov-tree prior." Signal Processing, IEEE Transactions on 60.7 (2012): 3439-3448.
Vasanawala, S. S., et al. "Practical parallel imaging compressed sensing MRI: Summary of two years of experience in accelerating body MRI of pediatric patients." Biomedical Imaging: From Nano to Macro, 2011 IEEE International Symposium on. IEEE, 2011, 1039-1043.
Wang, Ge, Yoram Bresler, and Vasilis Ntziachristos. "Guest editorial compressive sensing for biomedical imaging." IEEE transactions on medical imaging 5.30 (2011): 1013-1016.

* cited by examiner

VARIABLE DENSITY INCOHERENT SPATIOTEMPORAL ACQUISITION (VISTA) FOR HIGHLY ACCELERATED MAGNETIC RESONANCE IMAGING

CROSS-REFERENCE TO RELATED APPLICATION

This application claims priority to U.S. Provisional Patent Application No. 61/932,732, filed Jan. 28, 2014, entitled "VARIABLE DENSITY INCOHERENT CONSTRAINED SAMPLING (VICS) FOR HIGHLY ACCELERATED MAGNETIC RESONANCE IMAGING," the disclosure of which is incorporated herein by reference in its entirety.

BACKGROUND

Led by technological advances, the field of MRI has evolved considerably over the last two decades. In recent years, compressive sensing (CS) has attracted considerable attention in the scientific community and demonstrated notable impact on several applications, including MRI. CS exploits the underlying sparsity of the image and allows image recovery from measurements that are far fewer than the ambient degrees of freedom. Recent studies have shown that the combination of CS and parallel MRI (pMRI) is effective in improving image quality and reducing acquisition time by achieving high acceleration rates for both static and dynamic applications.

An effective application of CS typically has three major requirements: the image is sparse in some transform domain, the undersampling artifact is incoherent (noise like) in the sparsifying transform domain, and the image is recovered by a nonlinear method that enforces both image sparsity and data consistency. For MRI, the first requirement is generally met as most MRI images are compressible in an appropriate transform domain, e.g., discrete Wavelet domain. In recent years, significant strides have been made towards the third requirement by developing fast recovery algorithms for large imaging problems. For the second requirement, the high degree of incoherence is generally achieved by employing either Cartesian patterns with random or pseudo-random sampling or non-Cartesian patterns. Although non-Cartesian sampling methods allow far greater flexibility in designing low-coherence sampling patterns, such sampling schemes are highly sensitive to system imperfections and have found limited use in clinical practice.

Even though random sampling generally provides a high degree of incoherence, such sampling patterns can generate inconsistent results due to excessively large gaps or clustering in the sampling pattern. The large gaps lead to high g-factor for pMRI, i.e., ill conditioning of the underlying inverse problem, and the clustering leads to high correlation among k-space data samples, leading to reduced acquisition efficiency. In contrast, pseudo-random sampling provides a high degree of incoherence while regulating the gaps between samples to a nearly uniform size. For MRI applications, empirical evidence indicates that pseudo-random sampling methods tend to generate superior results compared to random sampling methods. For purely spatial MRI applications, Poisson-disk sampling (PDS) remains a popular pseudo-random sampling scheme. Also, PDS can easily incorporate variable sampling density to preferentially sample center regions of k-space with high SNR. PDS, however, cannot be readily extended to heterogeneous domains because it does not allow incorporating domain-specific constraints. For example, in k-t domain, PDS does not provide a mechanism to maintain a constant temporal resolution by fixing the number of samples (readouts) in each time frame. Therefore, in order to effectively apply CS to MRI in heterogeneous domains, often random sampling is employed, which has the tendency to generate inconsistent results.

SUMMARY

Herein is disclosed a novel k-t sampling method called variable density incoherent spatiotemporal acquisition (VISTA). Like PDS or other pseudo-random methods, VISTA provides for 1) uniform coverage of the acquisition domain with regular gaps between samples, 2) incoherence, and 3) frequent sampling of the central region of k-space with high SNR. The iterative nature of the VISTA design allows additional flexibility not offered by other pseudo-random sampling techniques. For example, VISTA possesses a unique ability to 1) maintain a constant temporal resolution by fixing the number of readouts per frame, 2) guarantee a fully-sampled, time-averaged k-space to facilitate GRAPPA or SPIRiT kernel estimation, 3) limit eddy currents by controlling the extent of jumps (in k-space) from one readout to the next, and (iv) allow distributing a precise, predefined number of samples. Herein, validation of VISTA is demonstrated through simulation as well as data from real-time, free-breathing cine. Although only applied to two-dimensional (2D) cine, VISTA can be extended to other applications and to higher dimensions.

In accordance with the present disclosure, there is described A sampling method called variable density incoherent Spatiotemporal Acquisition (VISTA) for MRI in an n-dimensional (nD) homogeneous (e.g., purely spatial) or heterogeneous (e.g., spatiotemporal) domains. The method may include initializing the location of samples on the nD grid; minimizing a cost function U by applying an iteration of gradient descent on sample locations under periodic boundary conditions; enforcing application specific constraints on the distribution of samples; and determining if a convergence has occurred.

In accordance with other aspects of the present disclose, a computer implemented apparatus for performing MRI using variable density incoherent Spatiotemporal Acquisition (VISTA) is described. The apparatus includes a memory and a processor that executes instructions to initializing the location of samples on the nD grid; minimizing a cost function U applying an iteration of gradient descent on sample locations under periodic boundary conditions; enforcing application specific constraints on the distribution of samples; and determining if a convergence has occurred.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not.

Herein is disclosed a novel k-t sampling method called variable density incoherent spatiotemporal acquisition (VISTA). Like Poisson disk sampling (PDS) or other pseudo-random methods, VISTA provides for 1) uniform coverage of the acquisition domain with regular gaps between samples, 2) incoherence, and 3) frequent sampling of the central region of k-space with high SNR. The iterative nature of the VISTA design allows additional flexibility not offered by other pseudo-random sampling techniques. For example, VISTA possesses a unique ability to 1) maintain a constant temporal resolution by fixing the number of readouts per frame, 2) guarantee a fully-sampled, time-averaged k-space to facilitate GRAPPA or SPIRiT kernel estimation, 3) limit eddy currents by controlling the extent of jumps (in k-space) from one readout to the next, and (iv) allow distributing a precise, predefined number of samples. Herein, validation of VISTA is demonstrated through simulation as well as data from real-time, free-breathing cine. Although an application to two-dimensional (2D) cine is described herein, VISTA can be extended to other applications and to higher dimensions.

Theory

Below is described the distribution based on minimal Riesz energy (MinRE), an underlying concept for the VISTA method. In addition, implementation details are provide for VISTA and SPIRiT-based image reconstruction (23).

MinRE

Figure 1:
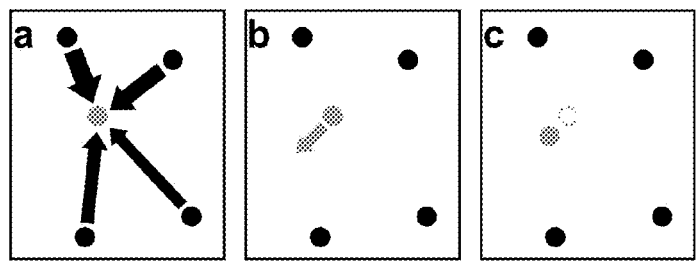
FIG. 1 illustrates ascertaining Fekete points.

The problem of obtaining uniform distribution of samples using MinRE has been investigated, and in its original version, the problem consists of determining the position of N samples (or points) on an n-sphere in Euclidean (n+1)-space such that a predefined measure of mutual distances among the samples is maximized. Practically, the distribution based on MinRE is obtained by minimizing a nonconvex cost function, U (26).

$$\hat{\vec{v}} = \underset{\vec{v}}{\mathrm{argmin}}\, U(\vec{v}; s, c) = \frac{1}{2}\sum_{i=1}^{N}\sum_{j\neq i}\frac{c^2}{\|\vec{v}_i - \vec{v}_j\|^s},\ \text{with } s>0, \quad 1)$$

where $c>0$ is a scaling constant, $\vec{v}_1, \ldots, \vec{v}_N$ represent N samples, with column vector $\vec{v}_j$ being the Cartesian coordinates in n+1 spatial dimensions defining the location of the $j^{th}$ sample on n-sphere. Here, $\|\vec{v}_i\|^s = (\vec{v}_i^T \vec{v}_i)^{s/2}$. The minimizing set of samples ($\hat{\vec{v}}$) is often referred to as "Fekete points." For s=1, U represents the electrostatic potential energy of N charged particles, each with charge c, on the sphere that repel each other according to the Coulomb's law. FIG. 1 illustrates an example of ascertaining Fekete points.

The value of U can be iteratively minimized using a gradient descent method. In each iteration, every sample is displaced in the direction of steepest descent: $-\vec{\nabla} U$. For the $r^{th}$ iteration, the displacement of the $i^{th}$ sample is given by, $$\vec{v}_i^{(r)} = \vec{v}_i^{(r-1)} - \lambda \vec{\nabla} U_i^{(r)},$$

where the constant $\lambda$ controls the displacement step size, and $-\vec{\nabla} U_i^{(r)}$ represents the steepest descent direction for the $i^{th}$ sample. After updating the location of the $i^{th}$ sample (Eq. 2), it is projected back to the manifold (sampling domain), which, for a unit sphere, is equivalent to normalizing $\vec{v}_i^{(r)}$) to unit length. The process is repeated for all points, and it is iterated until convergence.

VISTA

For 2D dynamic CMR, a distribution may be determined based on MinRE on a k-t grid, which can be achieved by minimizing U over a 2D Cartesian grid under periodic boundary conditions. To create variable sampling density, the cost function may be modified by replacing c with $c(\vec{v})$ in Eq. 1, yielding $$\hat{\vec{v}} = \underset{\vec{v}}{\mathrm{argmin}}\, U(\vec{v}; s, c, W) \text{ subject to } \vec{v} \in C \text{ where} \quad 3)$$

$$U(\vec{v}; s, c, W) = \frac{1}{2}\sum_{i=1}^{N}\sum_{j\neq i}\frac{c(\vec{v}_i)c(\vec{v}_j)}{\|\vec{v}_i - \vec{v}_j\|_W^s},\ \text{with } s>0,$$

Here, $\vec{v}_i \equiv (k_i, t_i)^T$ defines the Cartesian coordinates of the $i^{th}$ sample on the k-t grid, $C$ represents user-defined constraints on the distribution of samples, and $\|\vec{v}_i\|_W^s = (\vec{v}_i^T W \vec{v}_i)^{s/2}$, with diagonal matrix W specifying the relative scaling of t and k dimensions of the k-t grid. The minimizing set of samples ($\hat{\vec{v}}$) gives VISTA.

Unlike the traditional MinRE problem (Eq. 1), $c(\vec{v})$ in VISTA is not constant and varies with location on the k-t grid. In terms of the Coulomb's law, this setup is analogous to introducing location-dependent changes in the magnitude of the electric charge on the samples. By reducing the magnitude of the charge near the center of k (phase encoding dimension), the sampling density towards the center can be increased. Although several parametric and nonparametric models can be used to represent $c(\vec{v})$, it may be a Gaussian function, as follows:

$$c(\vec{v}) = c(k, t) \equiv 1 - \alpha \exp\left(-\frac{\left(k - \frac{K}{2} - 1\right)^2}{2\sigma^2}\right), \quad 4)$$

where $1 \leq k \leq K$ is the phase encoding index, and the parameters $0 \leq \alpha \leq 1$ and $\sigma > 0$ control the sampling density profile. Note, $c(\vec{v})$ is only a function of k but not t because no density variation is desired along time.

For a given choice of $c(\vec{v})$, the value of U in Eq. 3 can be iteratively minimized using a gradient descent method, where every sample is displaced in the direction of steepest descent in each iteration. For the $i^{th}$ sample, the negative of the steepest descent (displacement direction) is given by $$\vec{\nabla} U_i = -\sum_{j \neq i} \left( \frac{sc(\vec{v}_i)c(\vec{v}_j)W[\vec{v}_i - \vec{v}_j]}{\|\vec{v}_i - \vec{v}_j\|_W^{s+2}} - \frac{c(\vec{v}_j)\vec{\nabla}c(\vec{v}_i)}{\|\vec{v}_i - \vec{v}_j\|_W^{s}} \right), \quad 5)$$

where $\vec{\nabla}c(\vec{v})$ is the gradient of $c(\vec{v})$ at location $\vec{v}_i$, and $W[\vec{v}_i - \vec{v}_j]$ represents a matrix-vector multiplication.

The iterative implementation of VISTA is suitable for incorporating a variety of constraints in the distribution of the samples. In this work, three constraints may be enforced: constant temporal resolution, fully sampled, time averaged k-space (FTAK), and sampling on a Cartesian grid. To ensure constant temporal resolution, the process may be begin with an initialization such that the number of samples across frames is either fixed or differ at the most by one. Subsequently, the second component of the gradient $\vec{\nabla}U_i$ is set to zero in each iteration to prohibit displacement across frames. The FTAK and Cartesian constraints can be similarly enforced using gradient projections. FTAK facilitates kernel estimation for GRAPPA or SPIRiT and thus eliminates the need to collect additional calibration data.

Figure 2:
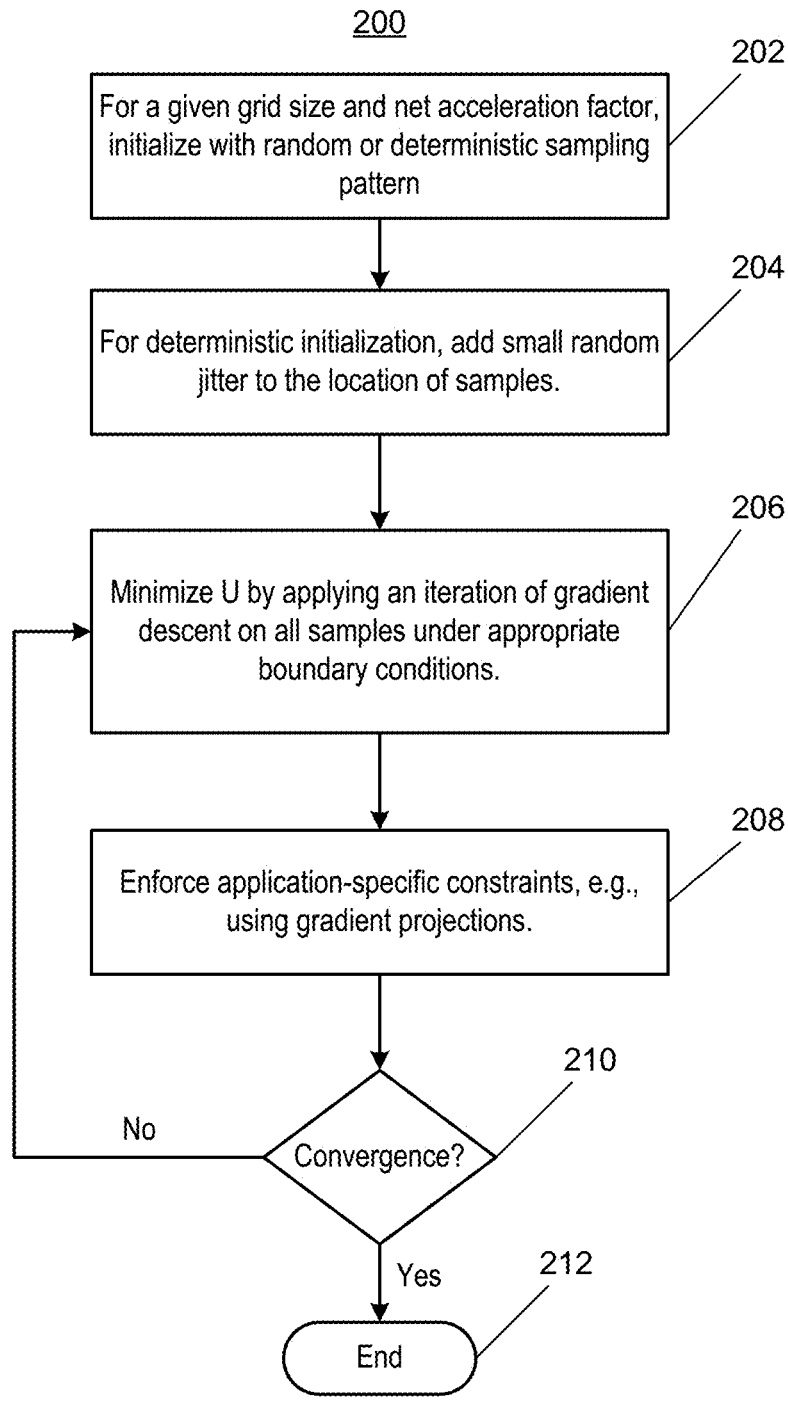
FIG. 2 illustrates an operational flow diagram of the process involved in computing VISTA.

With reference to FIG. 2, there is illustrated an operational flow diagram of the process involved in computing VISTA:

STAGE I (Optional)

At 202, for a given grid size and net acceleration rate, R, and initialization is performed with random or deterministic sampling pattern. At 204, if the initialization is deterministic, a small random jitter is added to the location of samples.

STAGE II

At 206, using the 2D sampling from 204 as an initialization, U (Eq. 3) is minimized by applying an iteration of gradient descent on all samples under appropriate boundary conditions.

At 208, application specific constraints are enforced. For example, for k-t sampling, a constant temporal resolution and FTAK are enforced via gradient projections.

At 210, it is determined if a convergence has occurred. If so, the process ends at 212; otherwise the process returns to 206.

Step 202 is intended to encourage in-frame uniformity. For a given $c(\vec{v})$ map, this step generates an identical distribution in each frame, with the distances between adjacent in-frame samples determined by the profile $c(\vec{v})$. Step 204 is included to ensure that there is some frame-to-frame variation in the distribution and thus avoid convergence to bad local minima in STAGE II. Since VISTA is sensitive to initialization, the inclusion of STAGE I promotes in-frame uniformity and positively impacts the output of STAGE II. The parameter W, in STAGE II, provides additional control over the uniformity in the k-t domain vs. the uniformity in individual frames.

Figure 3:
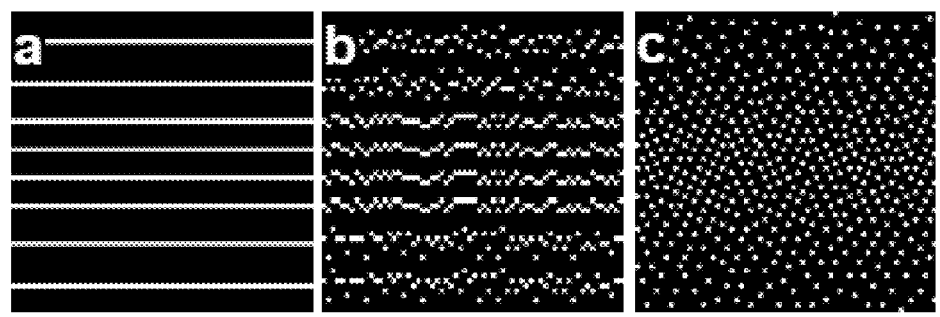
FIG. 3 illustrates the sampling pattern after performing the operational flow of FIG. 2 on a 2D k-t domain.

FIG. 3 illustrates the sampling patterns after steps 202-210 are performed on a 2D k-t grid. In FIG. 3, horizontal and vertical axes represent time and phase encoding directions, respectively; a: Deterministic distribution from STAGE I (202); b: The distribution in (a) after adding a random jitter (204, STAGE I); c: From the initialization given in (b), VISTA pattern (210, STAGE II) achieved by minimizing the cost function given in Eq. 3 under the constraints of constant temporal resolution and FTAK.

Figure 4:
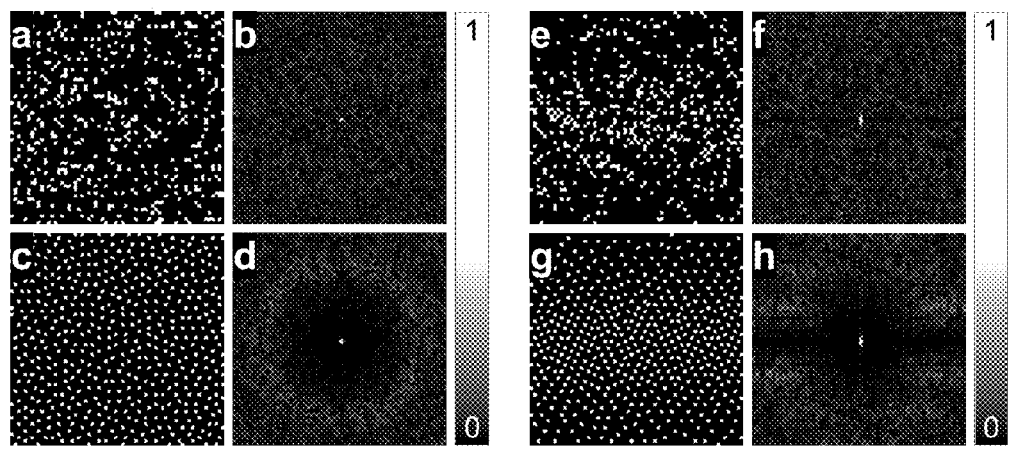
FIG. 4 illustrates a point spread function (PSF) of 2D Fekete points and VISTA patterns on a 2D k-t grid.

The uniformity of the distribution based on MinRE has been studied, but the incoherence of such sampling patterns has not been previously considered. VISTA, when initialized with random or perturbed patterns, results in incoherent sampling patterns in the ambient k-t domain. FIG. 4 shows the 2D point spread function (PSF) of MinRE and VISTA patterns. The PSF was computed by taking the 2D FFT of the sampling pattern in the k-t domain. Here, the sidelobes of the PSF are used as a surrogate measure of incoherence. The PSF of the distribution based on MinRE has a visible annulus and strongly resembles the previously reported PSF of PDS. Compared to the distribution based on MinRE, VISTA has slightly stronger coherence, which reflects the structure introduced by additional constraints enforced in VISTA. Note, MinRE and VISTA exhibit incoherence in the ambient sampling domain, which may or may not fully translate to incoherence in a transform domain, but this limitation is not unique to VISTA and extends to almost all random or pseudo-random sampling patterns.

Advantages Over PDS

Dynamic pMRI, with two spatial and one temporal dimension, is not a true 3D problem. Although the sparsity promoting regularization can be applied in the joint 3D spatiotemporal domain, the self-consistency constraint, which originates from employing multiple receiver coils, still applies to individual 2D frames and can benefit from the in-frame uniformity of the sampling. Therefore, uniformity of the distribution both in the k-t domain and in individual frames, along with the incoherence in the k-t domain, plays an important role in determining image quality. VISTA, by controlling the initialization (STAGE I) and the diagonal entries of W in Eq. 3, can manage uniformity in both 2D k-t domain and individual frames, while PDS has no mechanism to control in-frame uniformity of the sampling. Also, unlike PDS, VISTA can ensure FTAK, which facilitates kernel estimation for SPIRiT-type methods or coil sensitivity estimation for SENSE-type methods.

Figure 5A:
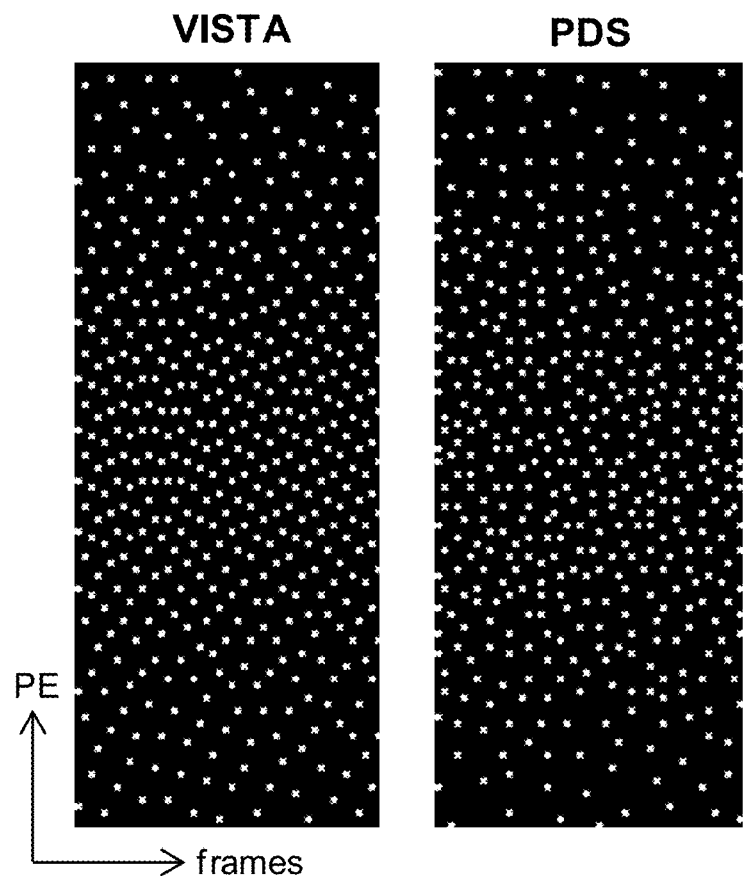
FIGS. 5A-5D illustrate example differences of VISTA versus Poisson disk sampling (PDS)
Figure 5B:
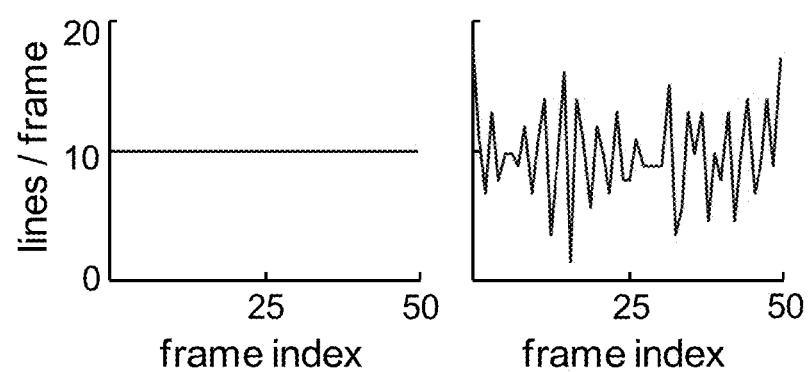
Figure 5C:
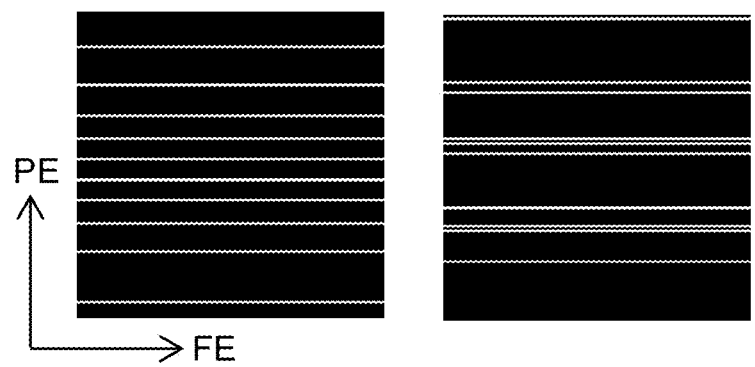
Figure 5D:
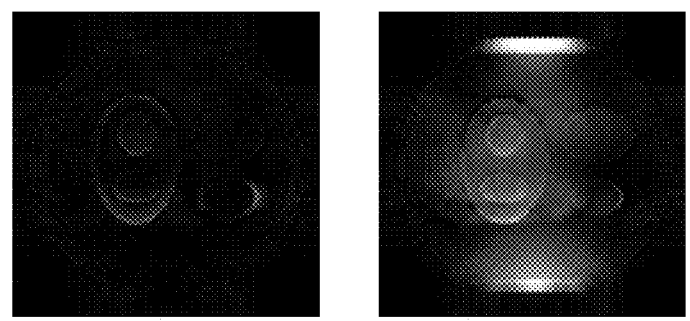

FIGS. 5A-5D illustrate example differences of VISTA versus PDS. The VISTA and PDS sampling patterns shown in FIG. 5A were used to simulate data from a 120×120 dynamic phantom with 48 frames. The phantom construction and the reconstruction process are described later in the manuscript. FIG. 5B displays the number of samples (readout lines) in each frame. In FIG. 5C, the sampling patterns in the 7$^{th}$ frame are shown. From FIG. 5C, it is clear that the uniformity provided by PDS in the k-t domain (FIG. 5A) does not translate to uniformity in individual frames. The sampling in individual frames of PDS is clustered and thus not conducive to pMRI. FIG. 5D shows error images (×5) for the 7$^{th}$ frame. Across all frames, the reconstruction from PDS had 76% higher root mean squared error (RMSE) compared to the reconstruction from VISTA.

PDS sampling, in its current form, cannot ensure a constant temporal resolution. The varying number of samples in each frame (FIG. 5B) makes PDS unsuitable for dynamic applications, where constant temporal resolution is desired. There is no trivial way to enforce a constant temporal resolution in PDS while maintaining the uniformity of the distribution. On the other hand, VISTA generates a sampling pattern by maximizing the separation among the samples via a cost function minimization, and this framework allows enforcing constant temporal resolution while maintaining uniformity.

Image Recovery

The SPIRiT method, an autocalibrating pMRI reconstruction method, offers a framework to incorporate sparsity-promoting spatiotemporal regularization into pMRI reconstruction and thus exploit both the sparsity of MRI signal and the incoherence of VISTA. Herein, a reconstruction framework ($l_1$-SPIRiT) may be used that combines SPIRiT with $l_1$-regularization in the joint spatiotemporal domain. If y represents the acquired noisy k-space data, x represents the desired full k-space data for all coils and all frames, S denotes the sampling pattern based on VISTA, and Gx represents frame-by-frame application of SPIRiT kernels, then x can be estimated by solving $$\hat{x} = \underset{x}{\mathrm{argmin}} \|Sx - y\|_2^2 + \lambda_1 \|Gx - x\|_2^2 + \lambda_2 \mathcal{R}(\Psi Fx), \quad 6)$$

where F represents the frame-by-frame inverse 2D FFT, $\Psi$ denotes the sparsifying transform for the spatiotemporal image Fx, operator $\mathcal{R}$ represents a hybrid $l_2$-$l_1$ norm ($l_2$ norm across coils followed by $l_1$ norm across the sparsifying domain), and $\lambda_1$ and $\lambda_2$ control the extent of data consistency (second term in Eq. 6) and regularization (third term in Eq. 6), respectively. Note, the application of VISTA is not tied to $l_1$-SPIRiT, and other image recovery methods, e.g., CS-SENSE, can equally benefit from the sampling method described herein.

Material and Methods

Generating Different Sampling Patterns

Below, an image reconstruction from VISTA is compared with image reconstruction from two commonly employed sampling methods: uniform interleaved sampling (UIS) and variable density random sampling (VRS). In VRS, each frame had an independent, random sampling pattern. For a fair comparison, the sampling density of VRS was adjusted such that it matched the sampling density of VISTA. Also, additional samples were added to the last frame of VRS to ensure VTAK.

Figure 6:
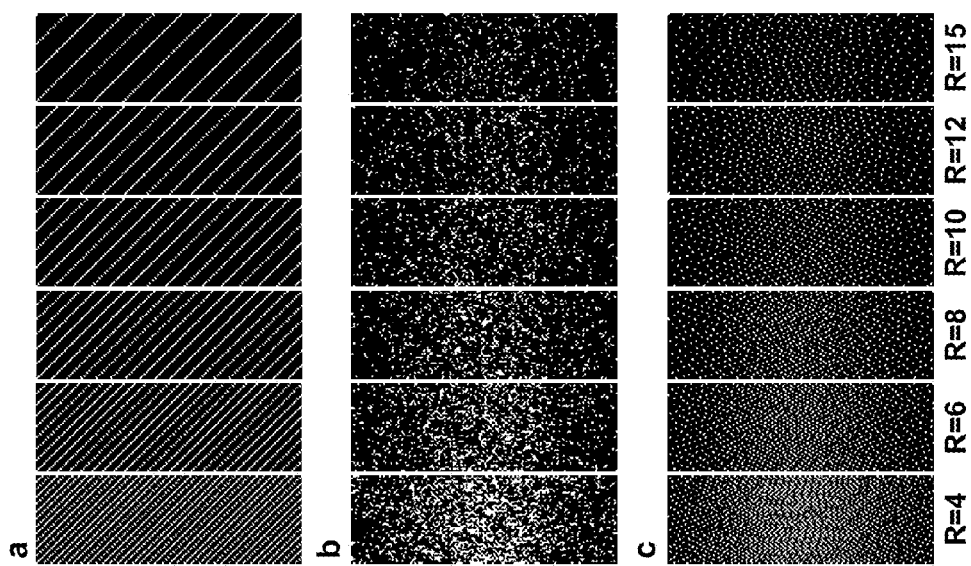
FIG. 6 illustrates spatiotemporal sampling patterns for in vivo real-time cine data.

A two-dimensional VISTA was computed using the two stages described with regard to FIG. 2. The cost function, U, in Eq. 3 was minimized using a gradient descent method under periodic boundary conditions. The value of s may be 1.4. To vary sampling density, $\alpha$=1/4 and $\sigma$=K/4. For the 2×2 diagonal matrix, W, W(1,1)=1 and W(2,2)=max(R/8, 1). A total of 100 iterations were used to minimize U. There was no difference in the parameter values or the implementation of VISTA used for simulation and in vivo studies except for the k-t grid size. For simulation, VISTA was generate on a 120×48 k-t grid, while for in vivo data, VISTA was generate on a 144×48 k-t grid. To avoid jumping back and forth along the k dimension, the samples in all odd frames were sorted in the ascending order while the samples in all even frames were sorted in the descending order. This reordering minimizes the gradient jumps from one readout line to the next. The comparison among the three sampling methods was made across eleven different acceleration rates: R=3-12, 15. Some of the sampling patterns used for in vivo data are shown in FIG. 6. In FIG. 6, the horizontal axis represents time (frames), and the vertical axis represents the phase encoding direction. Each sample on the 2D grid represents a readout line along the third orthogonal direction (not shown); a: Uniform interleaved sampling; b: Variable density random sampling; c: VISTA with variable density. Only six (out of eleven) acceleration rates are displayed.

Implementation of $l_1$-SPIRiT $l_1$-SPIRiT was implemented by solving the optimization problem given in Eq. 6 via nonlinear conjugate gradient (NLCG) with backtracking line-search. To compute the derivative of the last term in Eq. 6, a smoothing technique was used that replaces the non-smooth $l_1$ norm with a smooth version by defining $\|x\|_1^1 = \Sigma_i \sqrt{x_i^* x_i + \epsilon}$, where $\epsilon$>0 is a small positive real number (smoothing parameter), $x_i$ and $x_i^*$ are the i$^{th}$ element of x and its complex conjugate, respectively.

To jointly exploit the structure across space and time, a regularization in the joint 3D spatiotemporal domain was applied. A weighted 3D redundant Haar wavelet (RHW$_3$) was used with single-level decomposition as the sparsifying transform, $\Psi$. The detail subbands along the third (time) dimension (LLH, LHH, HLH, and HHH) were weighted by R, the net acceleration rate. This weighting is intended to capture the higher temporal correlation expected at higher R as a result of increased frame rate. Since the edges in individual coil images appear in the same spatial position, wavelet coefficients exhibit similar sparsity patterns across coils. To exploit this structure across coils, a joint sparsity model was used, which employs a hybrid $l_2$-$l_1$ norm for the wavelet coefficients.

The SPIRiT kernels of size 7×7—used to construct the matrix G in Eq. 6—were estimated from FTAK. For the VRS and VISTS datasets, $\lambda_1$=1×10$^{-2}$, $\lambda_2$=5×10$^{-6}$. For the UIS datasets, $\lambda_1$=1×10$^{-2}$, $\lambda_2$=10×10$^{-6}$. For all datasets, weighting of the detail subbands of RHW$_3$ along the time dimension was set equal to R. Before processing, the measured k-spaced data, y, was normalized by multiplying with 100 $\sqrt{N_c}/\|y\|_2$. These parameters values were selected based on our experience with the simulated data. The same parameter values were used for simulation and in vivo data.

A total of 30 NLCG iterations were used to perform the minimization in Eq. 6. For the first 27 (90%) iterations, the estimated data were replaced with the measured noisy data, while for the last 3 (10%) iterations, the estimated data were allowed to evolve and not replaced with the measured noisy data. It may be observed that initialization has an impact on the number of iterations it takes for $l_1$-SPIRiT reconstruction to converge. Herein, an initialization was used that employed view-sharing across three adjacent frames followed by the application of GRAPPA with 2 ×11 kernel size. This initialization led to faster convergence, well before 30 NLCG iterations. After the final iteration, the individual coil images were combined using the sum-of-squares (SoS) method.

Performance Metrics

Variable density sampling patterns and regularized image recovery methods invariably offer a trade-off between image sharpness and SNR, much like the bias-variance trade-off encountered in the estimation theory. For the in vivo cine data, two quantitative performance metrics of noise and edge sharpness were used and one qualitative performance metric was used based on expert evaluation of overall image quality. The sharpness was quantified for the left ventricular boundary in short-axis orientation. To improve measurement accuracy, all frames were collectively used to measure the sharpness. For each sampling method, three expert readers—a physicist (OPS) with over 20 years of CMR experience, a cardiologist (JC) with Level III certification in CMR, and a radiologist (JSS) with 5 years of CMR experience—evaluated the overall image quality using a Likert scale (1-5, worst-best), with the score of 3 or more representing adequate diagnostic quality. For the simulation data, where the noiseless ground truth is available, three quantitative performance metrics: RMSE, noise, and edge sharpness may be used.

The sharpness quantification method used in this work is based on parametric modeling of image edges, where the image intensity profiles across user-selected edges are modeled by a sigmoid function. There are no standard methods for measuring SNR or noise when spatiotemporal regularization is applied because it correlates noise across space and time. Herein, the image difference-based method may be extended such that the impact of correlation across neighboring frames is minimized. First, an image region or regions was selected which are either static or have minimal signal, e.g., the peripheral air regions. Second, the data from these regions were organized into a 2D matrix, with the ith column containing all the pixels from the selected regions in the ith frame. Third, the ordering of the columns was randomized to minimize the impact of correlation across neighboring frames. Fourth, the forward difference was computed across columns by subtracting the ith column from the (i+1)th column. Fifth, the resulting matrix, with i−1 columns, was rearranged into a 1D vector. Last, the standard deviation of the vector was defined as noise.

Simulation

Figure 7:
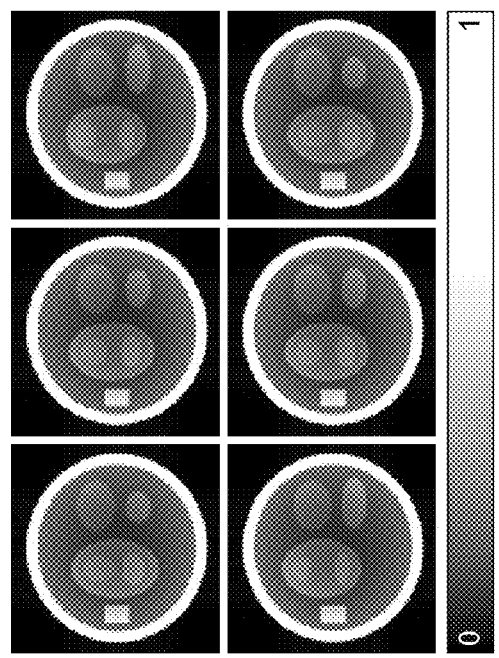
FIG. 7 illustrates representative frames from a 120×120 digital phantom used in a simulation.

To compare imaging results from UIS, VRS, and VISTA, a 120×120 dynamic digital phantom with 48 temporal frames was created in Matlab (Mathworks, Natick, Mass. USA). The phantom consisted of both dynamic and static features. The dynamic ellipses had periodic motion, with the frequency of the motion inversely proportional to the acceleration rate, R. To emulate experimental conditions, twelve uniformly spaced circular receive coils were simulated around the phantom using the Biot-Savart law. The image frames generated from the SoS of fully sampled, noiseless data were used as the ground truth; six such frames are shown in FIG. 7, which illustrates representative frames from a 120×120 digital phantom used in the simulation show both static (ellipses and a rectangle) and dynamic (ellipsis) features. The frames were selected to capture the distinct phases of the cyclic motion of the dynamic features.

Real-Time Cine

Real-time cardiac cine data were acquired with UIS, VRS, and VISTA (3T Siemens, 32 channel cardiac array) at eleven different acceleration rates (R=3-12, 15) from two healthy volunteers. When the net acceleration rate was not an integer, the reported R represents the value after rounding the net acceleration rate to the nearest integer. The acquisition was carried out under free-breathing conditions in both short and long axis orientations. Other imaging parameters included: 48 frames, 224×144 matrix size, 360×288 mm² FOV, 8 mm slice thickness, SSFP sequence, TE of 1 ms, TR of 2.8 ms, receiver bandwidth 1500 Hz/pixel, and flip angle 60°. To collect data on the scanner, each sampling pattern was stored and retrieved as a lookup table. The acquisition order of the three patterns was randomized to minimize bias. For each volunteer, all 66 datasets (3 sampling patterns, 11 acceleration rates, and 2 views) were collected back-to-back in one session. All aspects of the human study were approved by the local Institutional Review Board and all subjects give written consent for participation.

Computing Resources

Figure 12:
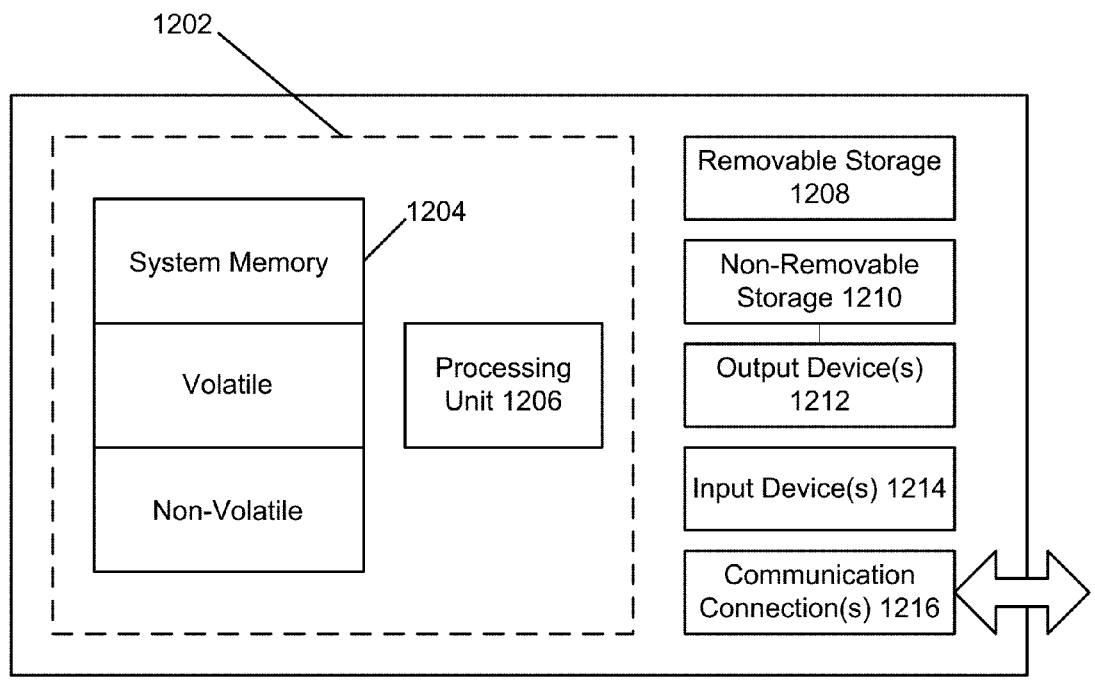
FIG. 12 is a block diagram that illustrates an example computing device.

All the data processing—including computation of VISTA and implementation of $l_1$-SPIRiT—was performed offline using a single workstation. The workstation is equipped with 64-bit Matlab. It has an 8-core Intel Core i7-960 CPU running at 3.20 GHz with 24 GB system memory. An example workstation is shown in FIG. 12. For in vivo experiments, VISTA was computed in advance and the resulting sampling patterns were stored as lookup tables. During acquisition, the phase encoding indices were read directly from the tables. Once the data were collected, they were transferred to the dedicated workstation where it was processed and analyzed. After acquisition, the data was transferred off-line for image reconstruction. For faster image reconstruction, the frequency encoding direction was cropped to approximately half of its original size, and the 32-channel data were compressed to generate 12 virtual channels.

Results

Simulation

Figure 8:
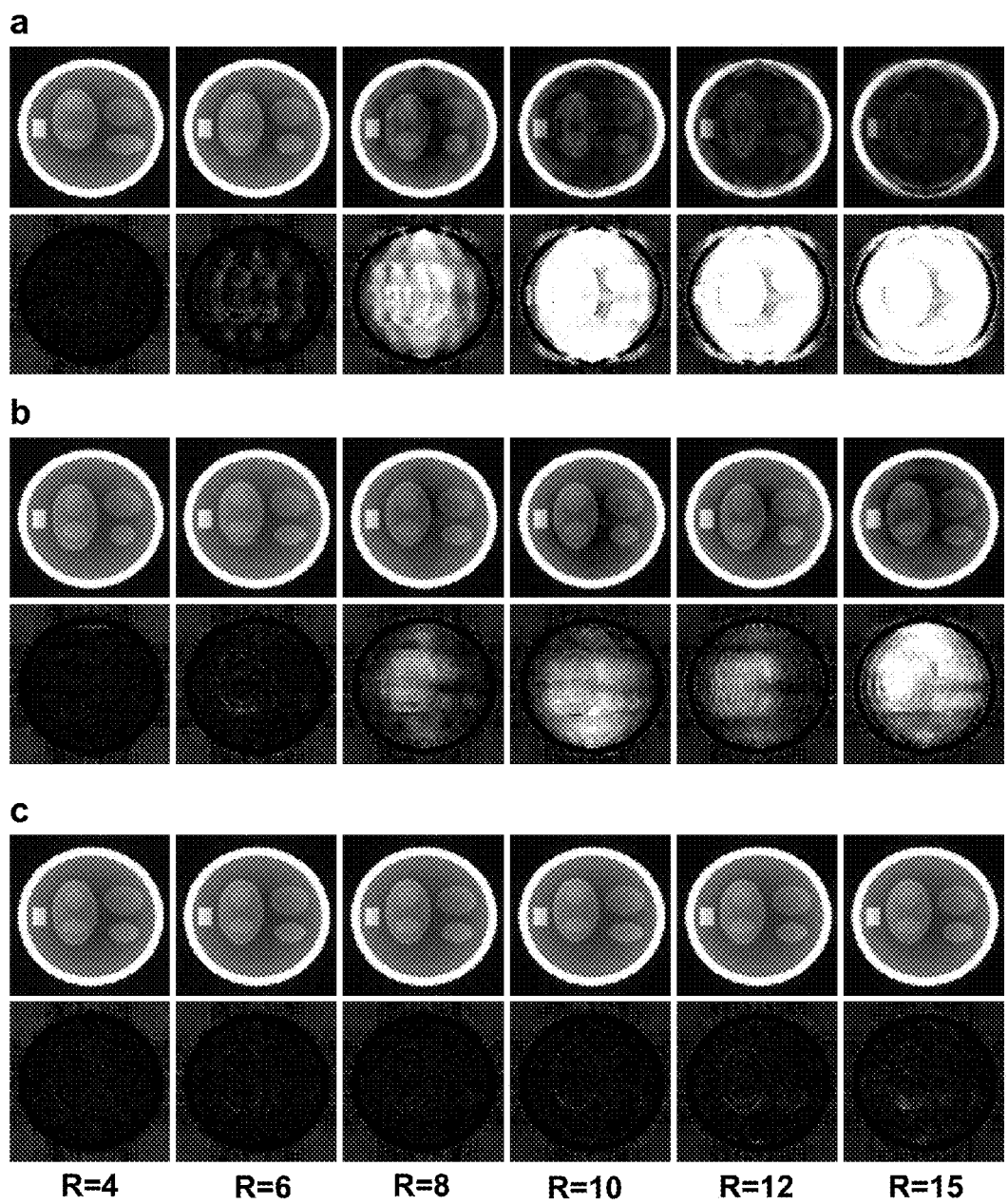
FIG. 8 illustrates example reconstruction results for the phantom shown in FIG. 7.
Figure 9:
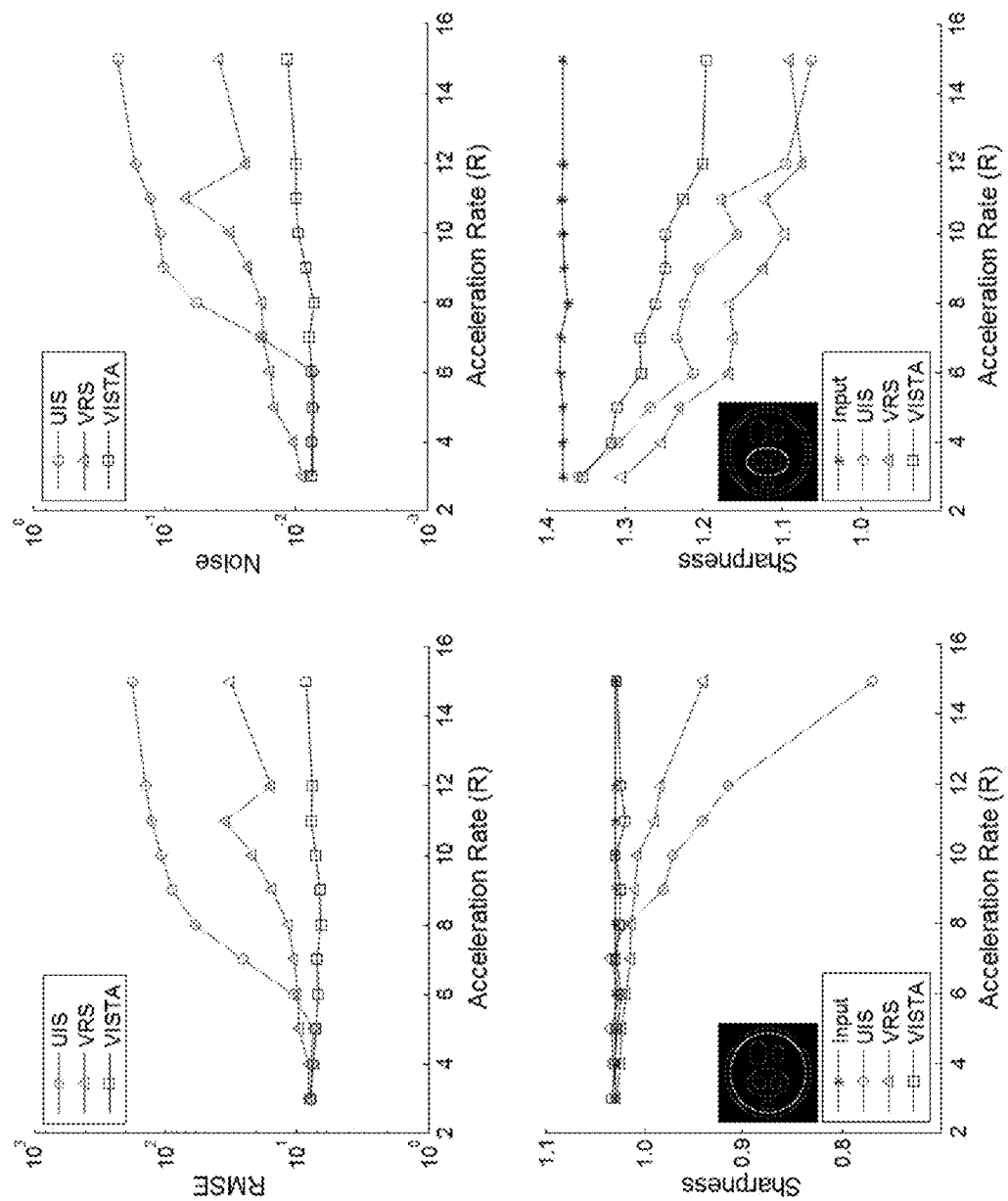
FIG. 9 illustrates the quality metrics of the reconstructed images.

For the three sampling patterns considered in this work, FIG. 8 shows the reconstruction results for six of the eleven acceleration rates. The difference images, after 5-fold amplification, are also shown. The frames shown here represent the worst case scenario, i.e., out of the 48 frames available for each sampling method, we have displayed the frame with the worst RMSE for that method. FIG. 9 shows the four quality metrics of the reconstructed images. Since temporal regularization affects static and dynamic edges differently, sharpness for a static and a dynamic edge is reported separately. The computation time for each dataset was approximately 20 min.

Real-Time Cine

Figure 10A:
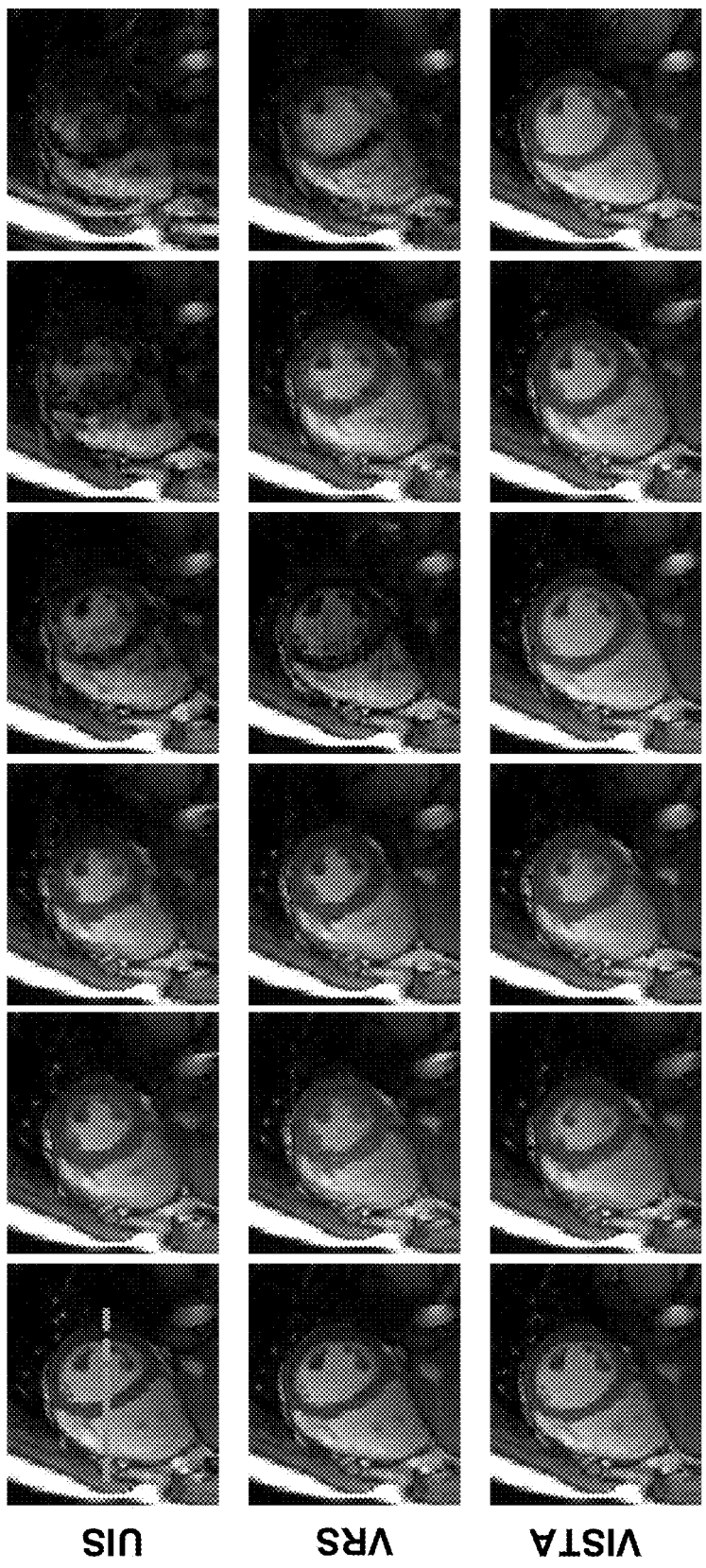
FIGS. 10A and 10B illustrate real-time, free-breathing cardiac MRI results for various acceleration rates (R) for uniform interleaved sampling (UIS), variable density random sampling (VRS), and VISTA.
Figure 10B:
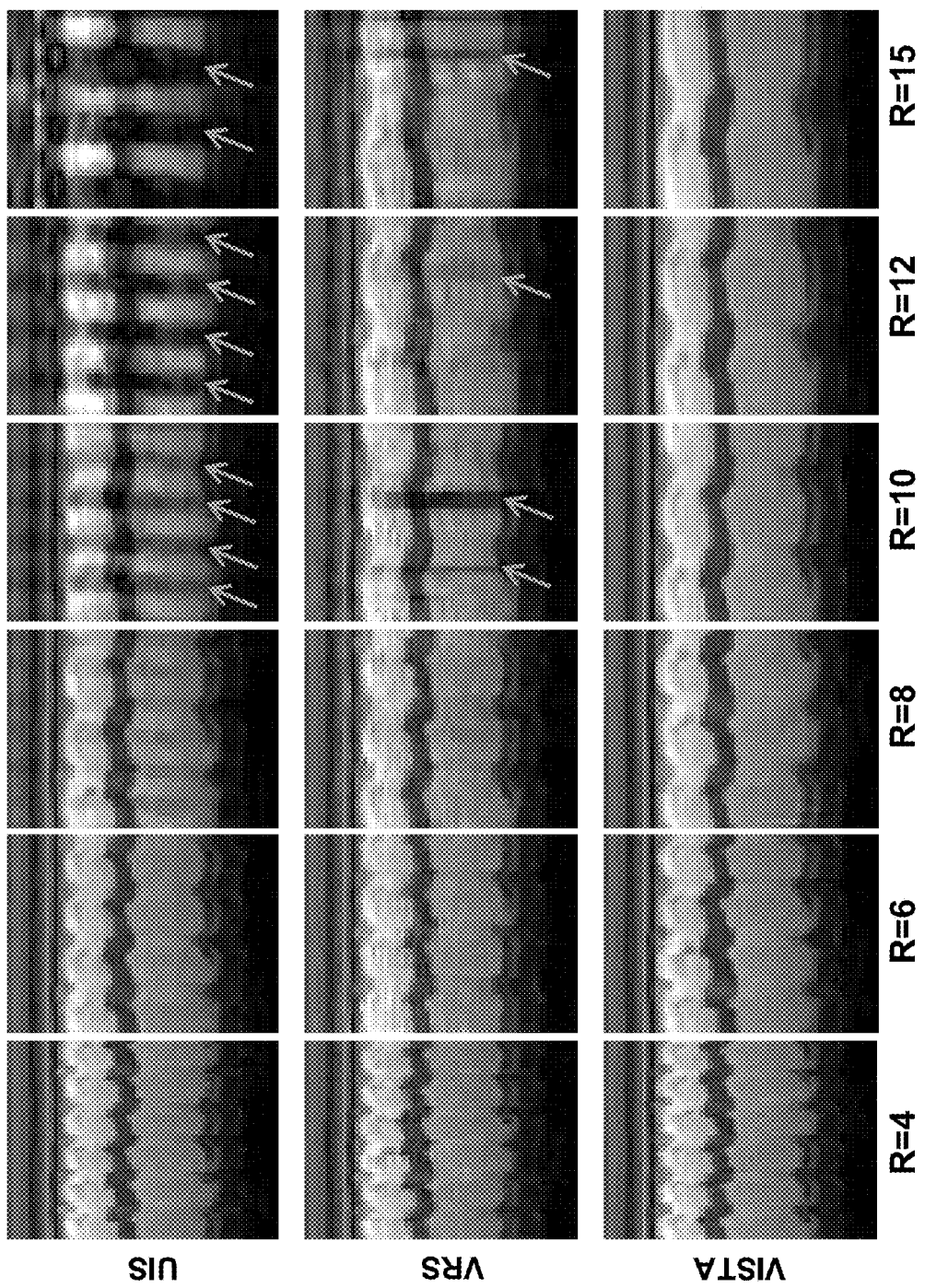

FIGS. 10A-10B show the reconstruction results for six of the eleven acceleration rates for UIS, VRS, and VISTA for volunteer A. FIG. 10A shows frames for the short-axis view, and FIG. 10B shows temporal profiles for pixels along the dashed line drawn on the top-left image in FIG. 10A. The arrows in FIG. 10B point to the visible artifacts in the reconstruction. The frames shown in FIG. 10A represent the worst case (in terms of visible artifacts) for each of the selected datasets. If all frames in a reconstructed image series had the same quality, the frame was picked at random.

Figure 11:
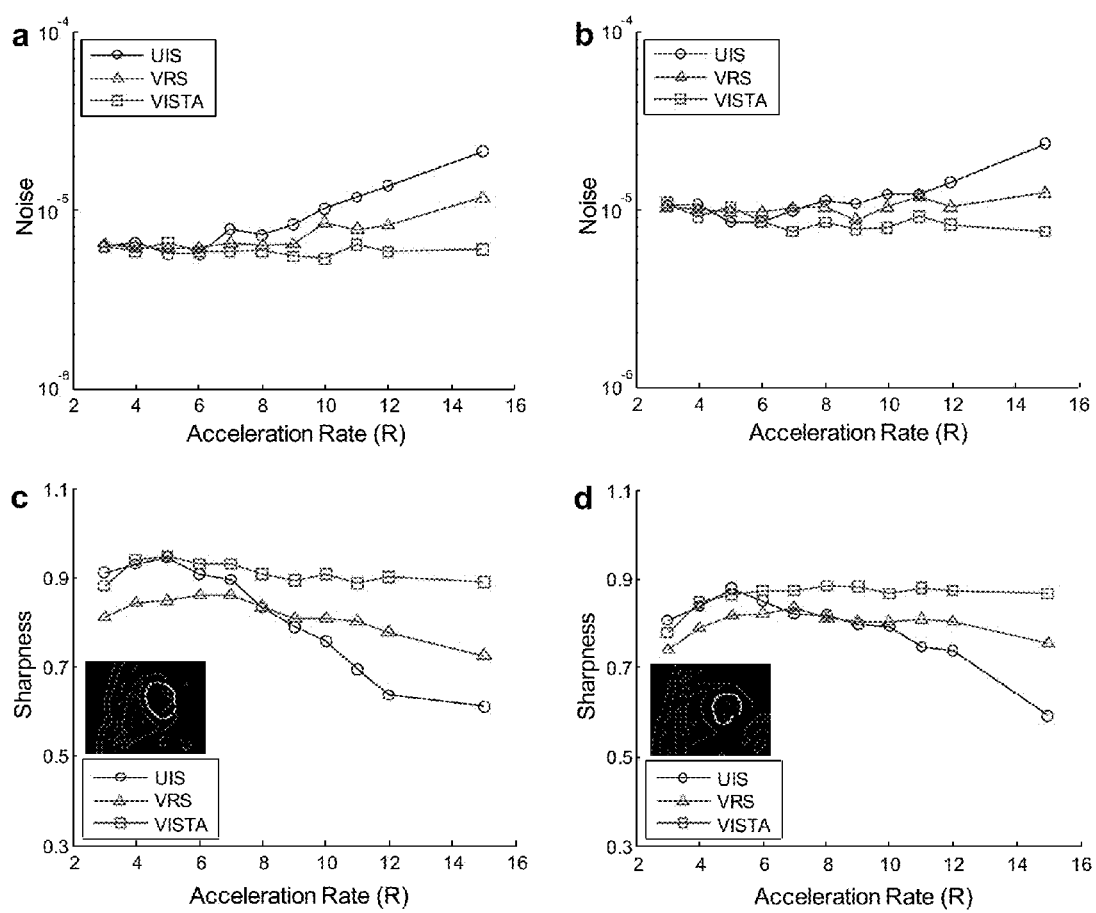
FIG. 11 illustrates the image quality metrics.

FIG. 11 shows the image quality metrics. The edge sharpness was measured for the left ventricular boundary in the short-axis orientation for volunteers A and B. Both noise and edge sharpness were measured separately in all four volunteers but are reported for the first two volunteers only. The results from the other two volunteers were similar and are not shown. The results of overall image quality as assessed by three expert readers are reported in Table 1. The reconstruction time for each dataset was approximately 25 to 30 min.

TABLE 1

Image quality scores using a Likert scale (1-5, worst-best).
Each entry represents an average score (±std) from four volunteers,
three expert readers, and two different views, i.e., n = 24

|  | R = 3 | 4 | 5 | 6 | 7 | 8 |
|---|---|---|---|---|---|---|
| UIS | 3.92 ± 0.88 | 4.21 ± 0.78 | 4.21 ± 0.78 | 3.83 ± 0.87 | 2.92 ± 0.78 | 2.75 ± 0.68 |
| VRS | 3.21 ± 0.66 | 3.58 ± 0.65 | 3.38 ± 0.71 | 3.17 ± 0.70 | 2.83 ± 0.70 | 2.92 ± 0.50 |
| VISTA | 3.71 ± 0.81 | 4.13 ± 0.80 | 4.21 ± 0.72 | 4.08 ± 0.72 | 4.08 ± 0.65 | 3.83 ± 0.64 |

|  | 9 | 10 | 11 | 12 | 15 |
|---|---|---|---|---|---|
| UIS | 2.25 ± 0.53 | 1.83 ± 0.70 | 1.54 ± 0.51 | 1.42 ± 0.50 | 1.13 ± 0.34 |
| VRS | 2.83 ± 0.64 | 2.08 ± 0.65 | 2.67 ± 0.70 | 2.38 ± 0.58 | 1.88 ± 0.68 |
| VISTA | 3.75 ± 0.61 | 3.63 ± 0.58 | 3.54 ± 0.72 | 3.54 ± 0.72 | 3.38 ± 0.58 |

Discussion

VISTA sampling when coupled with joint spatiotemporal reconstruction results in high fidelity images with minimal aliasing artifacts. As indicated by simulation and small in vivo study, the VISTA reconstruction exhibits lower RMSE, higher SNR, and higher edge sharpness compared with UIS and VRS. The evaluation by the experts also indicates that VISTA-based images retain adequate diagnostic quality at high acceleration rates. For rate twelve, only one of the 24 scores assigned to VISTA-based reconstruction was below 3 (diagnostically unacceptable). Likewise, only one of the 24 scores assigned to VISTA-based reconstruction was below 3 for rate fifteen. In contrast, for UIS and VRS, 100% and 58% of the scores were below 3 at rate twelve, respectively, and 100% and 83% of the scores were below 3 at rate fifteen, respectively.

The image quality for UIS and VISTA is similar at low acceleration rates (Table 1 and FIG. 11), where the problem is well-conditioned and does not rely heavily on the regularization. At high acceleration rates, where the image recovery relies more on the regularization, VISTA consistently outperforms UIS. At high acceleration rates, UIS generates images with strong undersampling artifacts. Such artifacts are visible at R>6 in both the simulation and the in vivo data. To suppress these excessive artifacts in UIS, we used slightly higher regularization ($\lambda_2$) compared to VISTA and VRS, but this higher value had a modest impact on the image quality. Further increase in $\lambda_2$ for UIS resulted in severe image blurring.

Compared with VISTA, the performance of VRS is consistently worse, even at low accelerations rates where the poor g-factor associated with VRS is not adequately compensated by its incoherence. A frame-by-frame examination of the image series reveals that VRS does not generate consistent results across all frames. This fact is evident from FIG. 9 that displays the worst case scenario. This uncertainty in the performance of VRS is often mitigated by including a fully sampled region in the center of the k-space. Since each coil in the array has a different phase map, its center of k-space center is slightly shifted from the nominal position. To account for this variation, the fully sampled region is selected conservatively and often spans a non-negligible fraction of the k-space to cover the high energy regions in all coils. The downside of this approach is that it limits the net acceleration that can be achieved using VRS. In addition, this approach reduces the sampling density for higher spatial frequency regions. Experimental observations show that increasing the sampling density in the central regions of k-space progressively degrades image resolution. Therefore, while the uncertainty in VRS results can be reduced by densely sampling the center of k-space, this strategy may only further degrade its image sharpness.

For both the phantom and the in vivo data, VISTA offers a better sharpness-noise trade-off, i.e., it is simultaneously superior in both categories. Interestingly, the sharpness curves of dynamic boundaries in the digital phantom (FIG. 9d) decrease steeply with acceleration rate and do not match the sharpness curves from the cine results that exhibit an initial increase followed by a more gradual decrease in sharpness (FIGS. 11c and 11d). The steeper decline in phantom sharpness can be attributed to higher initial sharpness of the digital phantom. For real-time cine results, the initial increase in measured sharpness, which is observed for all three sampling methods, reflects the impact of intra-frame cardiac motion that is present in the cine data and not in the phantom data. For a given experimental setup, a lower acceleration rate equates to a lower temporal resolution for real-time cine. Therefore, the effect of the intra-frame motion gets progressively worse with a decrease in acceleration rate, leading to sharpness loss at lower acceleration rates. This intra-frame motion is also responsible for the relatively lower quality scores at rates 3 and 4 (Table 1).

VISTA offers a framework to generate pseudo-random, incoherent sampling patterns with parametrically controlled sampling density. More importantly, the iterative nature of VISTA allows flexibility that is not present in other pseudo-random sampling methods. For example, in VISTA, it is possible to ensure that the average-all data are fully sampled in k-space or that the number of readout lines in each frame is fixed. Also, VISTA has the potential of offering other advantages. For example, by manipulating the matrix W in Eq. 3, it is possible to generate sampling with anisotropic acceleration.

A Matlab implementation of VISTA may be slower compared with other pseudo-random methods. For the data presented here, it took approximately two to three minutes to compute VISTA for the worst case (largest k-t grid, lowest acceleration). However, the implementation of VISTA can be sped up by C++ implementation and parallel computing using graphical processing units. For a given CMR application, it is anticipated that the number of tables required to cover a wide range of experimental conditions will only be in the hundreds. Therefore, look-up tables also provide an alternate solution.

The flexibility of VISTA inadvertently introduces free parameters. For the VISTA setup reported in this work, the user selects four parameters: s, α, σ, and second diagonal entry of W, i.e., W(2,2). For example, s=1.4 may be selected, but selecting a different value in the range of $1 \leq s \leq 1.5$ did not have a significant impact on incoherence or image quality.

The values of α and σ control the sampling density and thus offer a trade-off between image sharpness and robustness. Densely sampling the center of k-space—at the expense of sampling in the peripheral regions—improves robustness but degrades image sharpness. Note, the problem of selecting an optimal sampling density is not unique to VISTA and common to all random or pseudo-random sampling methods. Herein, α=1/4, σ=K/4, and W(2,2)=max(R/8, 1).

Thus, the present disclosure presents a pseudo-random, incoherent sampling technique, VISTA, which is based on minimal Riesz energy problem. Compared with other pseudo-random methods, e.g., Poisson-Disk sampling, VISTA has the unique ability to incorporate a variety of problem-specific constraints. In this work, VISTA was applied to real-time CMR, where it not only provided an incoherent sampling with variable density but also ensured a constant temporal resolution and a fully-sampled time-averaged data. VISTA was validated using simulation and in vivo data. Compared with other commonly employed sampling strategies, VISTA generates more consistent results with superior noise-sharpness trade-off, especially at high acceleration rates.

When the logical operations described herein are implemented in software, the process may execute on any type of computing architecture or platform. For example, referring to FIG. 12, an example computing device upon which embodiments of the invention may be implemented is illustrated. In particular, the network device discussed above may be a computing device, such as computing device 1200 shown in FIG. 12. It should be understood that the computing device 1200 can be incorporated in or remote from an MRI scanner such as the example MRI scanner described above. The computing device 1200 may include a bus or other communication mechanism for communicating information among various components of the computing device 1200. In its most basic configuration, computing device 1200 typically includes at least one processing unit 1206 and system memory 1204. Depending on the exact configuration and type of computing device, system memory 1204 may be volatile (such as random access memory (RAM)), non-volatile (such as read-only memory (ROM), flash memory, etc.), or some combination of the two. This most basic configuration is illustrated in FIG. 12 by dashed line 1202. The processing unit 1206 may be a standard programmable processor that performs arithmetic and logic operations necessary for operation of the computing device 1200.

Computing device 1200 may have additional features/functionality. For example, computing device 1200 may include additional storage such as removable storage 1208 and non-removable storage 1210 including, but not limited to, magnetic or optical disks or tapes. Computing device 1200 may also contain network connection(s) 1216 that allow the device to communicate with other devices. Computing device 1200 may also have input device(s) 1214 such as a keyboard, mouse, touch screen, etc. Output device(s) 1212 such as a display, speakers, printer, etc. may also be included. The additional devices may be connected to the bus in order to facilitate communication of data among the components of the computing device 1200. All these devices are well known in the art and need not be discussed at length here.

The processing unit 1206 may be configured to execute program code encoded in tangible, computer-readable media. Computer-readable media refers to any media that is capable of providing data that causes the computing device 1200 (i.e., a machine) to operate in a particular fashion. Various computer-readable media may be utilized to provide instructions to the processing unit 1206 for execution. Common forms of computer-readable media include, for example, magnetic media, optical media, physical media, memory chips or cartridges, a carrier wave, or any other medium from which a computer can read. Example computer-readable media may include, but is not limited to, volatile media, non-volatile media and transmission media. Volatile and non-volatile media may be implemented in any method or technology for storage of information such as computer readable instructions, data structures, program modules or other data and common forms are discussed in detail below. Transmission media may include coaxial cables, copper wires and/or fiber optic cables, as well as acoustic or light waves, such as those generated during radio-wave and infra-red data communication. Example tangible, computer-readable recording media include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In an example implementation, the processing unit 1206 may execute program code stored in the system memory 1204. For example, the bus may carry data to the system memory 1204, from which the processing unit 1206 receives and executes instructions. The data received by the system memory 1204 may optionally be stored on the removable storage 1208 or the non-removable storage 1210 before or after execution by the processing unit 1206.

Computing device 1200 typically includes a variety of computer-readable media. Computer-readable media can be any available media that can be accessed by device 1200 and includes both volatile and non-volatile media, removable and non-removable media. Computer storage media include volatile and non-volatile, and removable and non-removable media implemented in any method or technology for storage of information such as computer readable instructions, data structures, program modules or other data. System memory 1204, removable storage 1208, and non-removable storage 1210 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 1200. Any such computer storage media may be part of computing device 1200.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method of Variable density Incoherent Spatiotemporal Acquisition (VISTA) for generating magnetic resonance imaging (MRI) sampling location of N data samples on an n-dimensional (nD) grid, comprising;
    initializing a location of N k-space samples on the nD grid;
    iteratively minimizing a cost function U to update the location of samples;
    enforcing application specific constraints on the distribution of samples in each iteration;
    generating a sampling pattern at each iteration; and
    storing each sampling pattern as a lookup table, whereby MR images are reconstructed from the data collected using the lookup table.

2. The method of claim 1, if the convergence has not occurred, repeating the minimizing and enforcing.

3. The method of claim 1, wherein a deterministic, random, or pseudorandom sampling is used as the initializing.

4. The method of claim 1, where the number of samples, N, is predefined by the user.

5. The method of claim 1, wherein gradient projections are applied to enforce application-specific constraints.

6. The method of claim 1, wherein a constraint is enforced such that averaging the samples along one of the n dimensions yields fully sampled data in (n−1)-dimensional domain.

7. The method of claim 1, wherein the location of samples is rounded to the nearest location on a Cartesian grid.

8. The method of claim 1, wherein partial-Fourier sampling is embedded into the VISTA framework by imposing antipodal symmetry on the sampling pattern.

9. The method of claim 1, further comprising different sampling domains, including: 3D spatial MRI (with 2D VISTA in $k_y$-$k_z$ domain); 2D cine at rest and stress (with 2D VISTA in $k_y$-t domain); 3D cine at rest and stress (with 3D VISTA in $k_y$-$k_z$-t domain); 2D and 3D multi-direction flow imaging (with 3D VISTA in $k_y$-t-velocity encoding domain and 4D VISTA in $k_y$-$k_z$t-velocity encoding domain, respectively); 2D myocardial perfusion (with 2D VISTA in $k_y$-t domain); 3D myocardial perfusion (with 3D VISTA in $k_y$-$k_z$-t domain); 3D dynamic angiography (with 3D VISTA in $k_y$-$k_z$-t domain); and 2D and 3D MR elastography (with 2D VISTA in $k_y$-phase offset domain and 3D VISTA in $k_y$-$k_z$-phase offset domain, respectively).

10. The method of claim 1, for 2D and 3D single-point acquisition for electron paramagnetic resonance imaging.

11. The method of claim 1, further comprising sampling in Cartesian and non-Cartesian domains, where one or more dimensions represent a variable other than space or time.

12. The method of claim 1, wherein the resulting sampling pattern is used for iterative or non-iterative image reconstruction methods.

13. The method of claim 1, wherein the distribution is obtained before full convergence is reached.

14. The method in claim 1, wherein a sample represents multiple k-space lines obtained by EPI sequence or an arm of a spiral or radial acquisition.

15. The method if claim 1, wherein one or more transmit and receive coils are used for acquisition.

16. The method of claim 1, wherein the cost function is represented by:

$$U(c, s, \omega_N) = \frac{1}{2}\sum_{i=1}^{N}\sum_{j \neq i} \frac{c(\vec{v}_i)c(\vec{v}_j)}{\|\vec{v}_i - \vec{v}_j\|_W^s}, \text{ with } s > 0 \text{ and } \omega_N \subset C \quad (4)$$

wherein, the column vector $\vec{v}_i$ defines the Cartesian coordinates of the $i^{th}$ sample on the grid, constraints are defined via $C$, and $\|\vec{v}_i\|_W^s = (\vec{v}_i^T W \vec{v}_i)^{s/2}$, with diagonal matrix W specifying the relative scaling of different dimensions.

17. The method of claim 16, wherein periodic or non-periodic boundary conditions are enforced.

18. The method of claim 16, wherein $c(\vec{v})$ is defined by parametric or nonparametric functions.

19. The method of claim 16, wherein the cost function U is iteratively minimized using a gradient based optimization methods.

20. The method of the claim 16, wherein a negative of the steepest descent for an $i^{th}$ sample is given by a relationship:

$$\vec{\nabla} U_i = -\sum_{j \neq i}\left(\frac{sc(\vec{v}_i)c(\vec{v}_j)W[\vec{v}_i - \vec{v}_j]}{\|\vec{v}_i - \vec{v}_j\|_W^{s+2}} - \frac{c(\vec{v}_j)\vec{\nabla} c(\vec{v}_i)}{\|\vec{v}_i - \vec{v}_j\|_W^s}\right),$$

wherein $\vec{\nabla} c(\vec{v}_i)$ is the gradient of $c(\vec{v})$ at $\vec{v}_i$, and $W[\vec{v}_i - \vec{v}_j]$ represents a matrix-vector multiplication.

21. A computer implemented apparatus for performing generating magnetic resonance imaging (MRI) using variable density incoherent Spatiotemporal Acquisition (VISTA), comprising;
    a memory;
    a processor; and
    computer executable instructions stored in the memory that when executed on the processor perform a method comprising:
    initializing a location of N k-space samples on the nD grid;
    iteratively minimizing a cost function U to update the location samples;
    enforcing application specific constraints on the distribution of samples in each iteration;
    generating a sampling pattern at each iteration; and storing each sampling pattern as a lookup table, whereby MR images are reconstructed from the data collected using the lookup table.

22. The apparatus of claim 21, wherein if the convergence has not occurred, the minimizing and enforcing constraints is repeated.

\* \* \* \* \*

UNITED STATES PATENT AND TRADEMARK OFFICE
CERTIFICATE OF CORRECTION

| | | |
|---|---|---|
| PATENT NO. | : 9,939,509 B2 | Page 1 of 1 |
| APPLICATION NO. | : 14/593322 | |
| DATED | : April 10, 2018 | |
| INVENTOR(S) | : Rizwan Ahmad et al. | |

It is certified that error appears in the above-identified patent and that said Letters Patent is hereby corrected as shown below:

In the Specification

Please add the following new paragraph before paragraph in Column 1 starting at Line 16:
--STATEMENT OF GOVERNMENT SUPPORT
This invention was made with government support under R01 HL102450 awarded by the National Institutes of Health. The government has certain rights in the invention.--

Signed and Sealed this
Thirtieth Day of October, 2018

Andrei Iancu
*Director of the United States Patent and Trademark Office*

UNITED STATES PATENT AND TRADEMARK OFFICE
CERTIFICATE OF CORRECTION

PATENT NO. : 9,939,509 B2
APPLICATION NO. : 14/593322
DATED : April 10, 2018
INVENTOR(S) : Ahmad et al.

Page 1 of 1

It is certified that error appears in the above-identified patent and that said Letters Patent is hereby corrected as shown below:

In the Specification

Column 1, Line 15 add the Government Support Clause:
--This invention was made with government support under HL102450 awarded by the National Institutes of Health. The government has certain rights in the invention.--

This certificate supersedes the Certificate of Correction issued October 30, 2018.

Signed and Sealed this
Twenty-ninth Day of September, 2020

Andrei Iancu
*Director of the United States Patent and Trademark Office*